United States Patent [19]

Takahashi et al.

[11] Patent Number: 5,328,737
[45] Date of Patent: Jul. 12, 1994

[54] METHOD OF FORMING FILM BY PLASMA CVD

[75] Inventors: Kiyoshi Takahashi, Ibaraki; Mikio Murai, Hirakata; Masaru Odagiri, Kawanishi; Hideyuki Ueda, Takatsuki; Yukikazu Ohchi, Kadoma; Tatsuya Hiwatashi, Kumamoto, all of Japan

[73] Assignee: Matsushita Electric Industrial Co., Ltd., Osaka, Japan

[21] Appl. No.: 38,297

[22] Filed: Mar. 29, 1993

[30] Foreign Application Priority Data

Mar. 30, 1992 [JP] Japan .................................. 4-072056

[51] Int. Cl.⁵ .............................................. B05D 3/06
[52] U.S. Cl. ..................................... 427/569; 427/128; 427/131; 427/248.1; 427/294
[58] Field of Search ......................... 427/569, 128-132, 427/294, 248.1

[56] References Cited

U.S. PATENT DOCUMENTS 4,645,977 2/1987 Kurokawa et al. ............. 315/111.21

FOREIGN PATENT DOCUMENTS 63-118074 5/1988 Japan .
4-248125 9/1992 Japan .

Primary Examiner—Bernard Pianalto
Attorney, Agent, or Firm—Wenderoth, Lind & Ponack

[57] ABSTRACT

A method of forming a film on a substrate by plasma CVD, comprising the steps of: providing a discharge tube in a vacuum chamber; providing a partition wall around the discharge tube; evacuating space between the discharge tube and the partition wall to vacuum; providing the substrate at a position confronting the discharge tube; and effecting plasma discharge in the discharge tube.

11 Claims, 9 Drawing Sheets

METHOD OF FORMING FILM BY PLASMA CVD

BACKGROUND OF THE INVENTION

The present invention relates to a plasma CVD (chemical vapor deposition) film forming method of forming a plasma-polymerized film and a diamondlike carbon film acting as a protective film for a metallic thin film type magnetic recording medium, an insulating film for semiconductor and liquid crystal, an amorphous silicon film acting as a photoelectric conversion element, a superconducting thin film, etc., which not only minimizes film forming defects but greatly increases the adhesive strength of the films themselves.

For forming a thin film by plasma CVD, a method is known in which the interior of a vacuum chamber is occupied by discharge space. However, this known method has a serious problem for industrial in that defects are produced on the thin film itself due to contamination of not only a base on which the thin film is formed, but also an inner face of a wall of the vacuum chamber. In order to solve this problem, a countermeasure in which a discharge tube is provided in the vacuum chamber is disclosed in, for example, Japanese Patent Publication No. 63-26195 (1988) or Japanese Patent Laid-Open Publication No. 63-118074 (1988). Furthermore, another countermeasure in which an ultra-low temperature panel is provided in the vacuum chamber is proposed in, for example, Japanese Patent Laid-Open Publication No. 4-248125 (1992). By employing these countermeasures, contamination of the interior of the vacuum chamber is substantially eliminated.

However, in the prior art methods referred to above, inconveniences are encountered, owing to the influence of unreacted gas leaking from the discharge tube, in that the adhesive strength of the formed thin film, relative to the base, is weak, and the reliability of the protective film or the insulating film, for example its durability, corrosion resistance, etc., are poor. Meanwhile, defects resulting from slight abnormal discharges due to sudden pressure change between the discharge tube and the interior of the vacuum chamber are produced on the film itself.

More concretely, in case the magnetic recording medium is a tape, its corrosion resistance drops and its dropout increases. Meanwhile, when the magnetic recording medium is a magnetic disk, its CSS (contact-start-and-stop) characteristics are not sufficient. Furthermore, when the magnetic recording medium is a photoelectric conversion element, such problems arise that its conversion efficiency drops with time and reliability of the insulating film for semiconductor or liquid crystal drops.

SUMMARY OF THE INVENTION

Accordingly, an essential object of the present invention is to provide a method of forming a thin film by plasma CVD which not only minimizes the influence of unreacted gas exerted at the time of formation of the thin film but eliminates film forming defects resulting from slight abnormal discharges due to sudden pressure change.

In order to accomplish this object of the present invention, a plasma CVD film forming method of the present invention comprises the steps of providing a discharge tube in a vacuum chamber; providing a partition wall around the discharge tube evacuating space between the discharge tube and the partition wall to vacuum, providing a substrate at a position confronting the discharge tube and effecting plasma discharge in the discharge tube so as to form a film on the substrate. Alternatively, a shield plate is provided at a distal end portion of the discharge tube so as to confront the substrate such that the film is formed on the substrate by plasma CVD.

By exhausting unreacted gas produced at the time of formation of the thin film in the above mentioned arrangement of the present invention, it becomes possible to not only obtain sufficient adhesive strength of the thin film relative to the substrate but eliminate film forming defects resulting from a slight abnormal discharge due to a sudden pressure discharge. Hence, in case the thin film is employed as a protective film for a magnetic recording medium, a magnetic tape or a magnetic disk having excellent durability and corrosion resistance can be obtained. Meanwhile, in case the thin film is employed as a photoelectric conversion element, an insulating film for semiconductor or liquid crystal or a superconducting thin film, its reliability can be upgraded remarkably.

BRIEF DESCRIPTION OF THE INVENTION

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
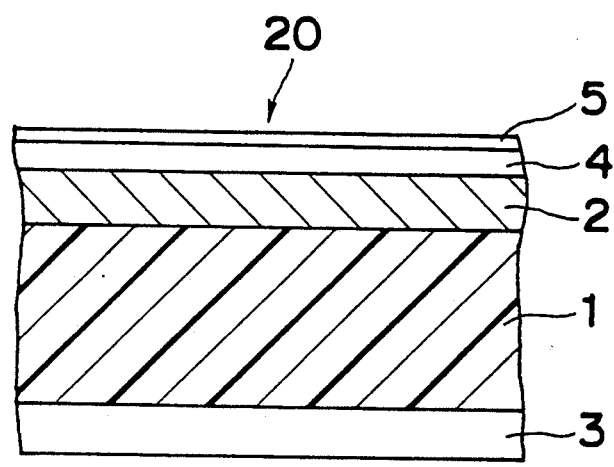
FIG. 1 is a sectional view of a magnetic tape produced by a plasma CVD film forming method according to a first embodiment of the present invention.

Referring now to the drawings, there is shown in FIG. 1 a magnetic tape 20 produced by a plasma CVD film forming method according to a first embodiment of the present invention. The magnetic tape 20 includes a non-magnetic base 1 formed by a polyester film of 3 to 20 μm in thickness, a ferromagnetic metallic thin film 2 formed on one face of the base 1, a back coating layer 3 formed on the other face of the base 1, a diamondlike carbon film 4 formed on the metallic thin film 2 and a lubricant layer 5 formed on the diamondlike carbon film 4. The metallic thin film 2 has a thickness of 0.1 to 0.2 μm and is formed by performing rhombic deposition of an alloy mainly consisting of Co through the introduction of oxygen. The back coating layer 3 is formed by coating a mixture of polyester resin, carbon, etc. The diamondlike carbon film 4 is formed by plasma CVD. The lubricant layer 5 is formed by wet coating or vacuum deposition.

Figure 2:
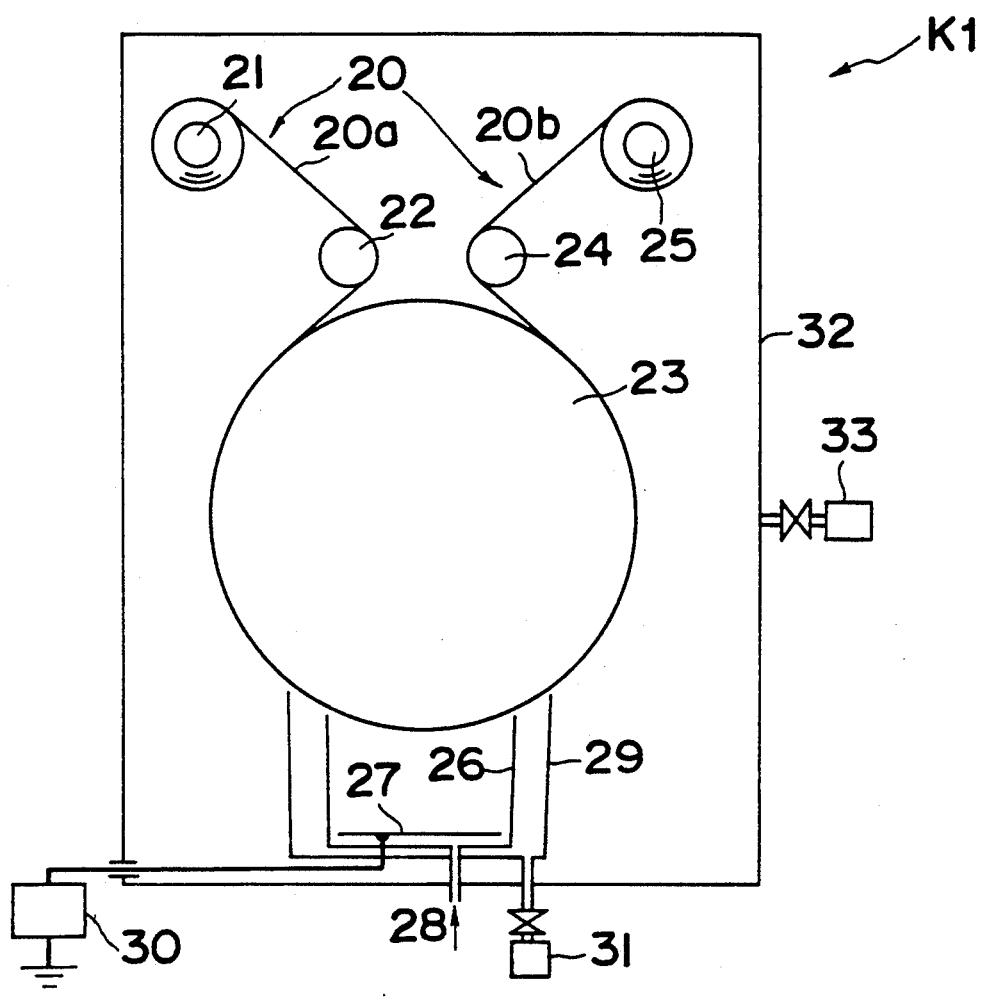
FIG. 2 is a schematic view of a plasma CVD apparatus used in the plasma CVD film forming method of FIG. 1 in which a partition wall is provided around a discharge tube.

FIG. 2 shows a plasma CVD apparatus K1 used for forming the diamondlike carbon film 4 of the magnetic tape 20 in the plasma CVD film forming method according to the first embodiment of the present invention. The diamondlike carbon film 4 of the magnetic tape 20 acts as a protective film of the magnetic tape 20. The plasma CVD apparatus K1 includes a vacuum chamber 32 in which various components are accommodated. The vacuum chamber 32 is evacuated to a vacuum by a vacuum pump 33. In FIG. 2, the magnetic tape 20 includes an unworked tape portion 20a in which the ferromagnetic metallic thin film 2 is formed on the non-magnetic base 1 and a worked tape portion 20b in which the diamondlike carbon film 4 is formed on the metallic thin film 2 of the unworked tape portion 20a. The unworked tape portion 20a is wound around a supply roller 21 and is fed from the supply roller 21 through control of its tension. Pass rollers 22 and 24 are brought into contact with the magnetic tape 20 so as to be rotated. A main roller 23 for transporting the magnetic tape 20 from the supply roller 21 to a take-up roller 25 is rotatably provided at a substantially central portion of the vacuum chamber 32. The main roller 23 is insulated from the vacuum chamber 32 and is grounded through refrigerant or the like. Rotation of the main roller 23 is controlled such that the magnetic tape 20 is fed at a predetermined speed. The worked tape portion 20b is continuously taken up by the take-up roller 25. At the take-up roller 25, tension of the worked tape portion 20b is controlled in the same manner as the unworked tape portion 20a at the supply roller 21.

The plasma CVD apparatus K1 further includes a discharge tube 26 for forming the diamondlike carbon film 4 on the metallic thin film 2 of the unworked tape portion 20a, an electrode 27 for generating plasma and a power source 30 connected to the electrode 27. The electrode 27 is disposed in the discharge tube 26. The power source 30 is operated on DC or AC of 50 Hz to 30 MHz or their combination and is capable of applying a voltage of 0.05 to 7 kV to the electrode 27. The discharge tube 26 has a gas inlet 28 for receiving raw material gas. Reactive gas of $H_2$, Ar or CH type, or vaporized gas of ketone or alcohol type, is introduced from the gas inlet 28 into the vacuum chamber 32 at a partial pressure of 0.5 to 0.001 Torr. The discharge tube 26, the electrode 27, the gas inlet 28 and the power source 30 constitute main components of the plasma CVD apparatus K1. A partition wall 29 surrounds the discharge tube 26 such that a space is defined between the discharge tube 26 and the partition wall 29. The space between the discharge tube 26 and the partition wall 29 is evacuated to a vacuum by a vacuum pump 31.

Hereinbelow, the plasma CVD film forming method according to the first embodiment of the present invention is described with reference to FIG. 2. Initially, the vacuum chamber 32 is evacuated by the vacuum pump 33, while the space between the discharge tube 26 and the partition wall 29 is evacuated by the vacuum pump 31. When the interior of the vacuum chamber 32 and the space between the discharge tube 26 and the partition wall 29 have reached predetermined degrees of vacuum of $1 \times 10^{-4}$ Torr and $1 \times 10^{-2}$ Torr, respectively, the unworked tape portion 20a formed with the metallic thin film 2 is brought into close contact with the main roller 23 so as to be continuously fed from the supply roller 21 towards the take-up roller 25. Subsequently, when the unworked tape portion 20a reaches a region in which the diamondlike carbon film 4 is formed on the metallic thin film 2 of the unworked tape portion 20a, raw material gas from the gas inlet 28 and a voltage applied by the power source 30 generate and accelerate a plasma ion current from the electrode 27 in the discharge tube 26. The plasma ion current collides with the metallic thin film 2 of the unworked tape portion 20a, which confronts the electrode 27, and thus the diamondlike carbon film 4 is formed on the metallic thin film 2 of the unworked tape portion 20a. As a result, the worked tape portion 20b is obtained. At this time, unreacted gas leaked from the gap between the discharge tube 26 and the magnetic tape 20 into the space between discharge tube 26 and the partition wall 29 is exhausted by the vacuum pump 31, and therefore does not cause contamination on the metallic thin film 2 and the diamondlike carbon film 4 of the worked tape portion 20b. Therefore, it becomes possible to increase the adhesive force between the metallic thin film 2 and the diamondlike carbon film 4 and between the diamondlike carbon film 4 and the lubricant layer 5 to be provided on the diamondlike carbon film 4. Accordingly, the corrosion resistance of the magnetic tape 20 in its practical performance is improved greatly.

Figure 3A:
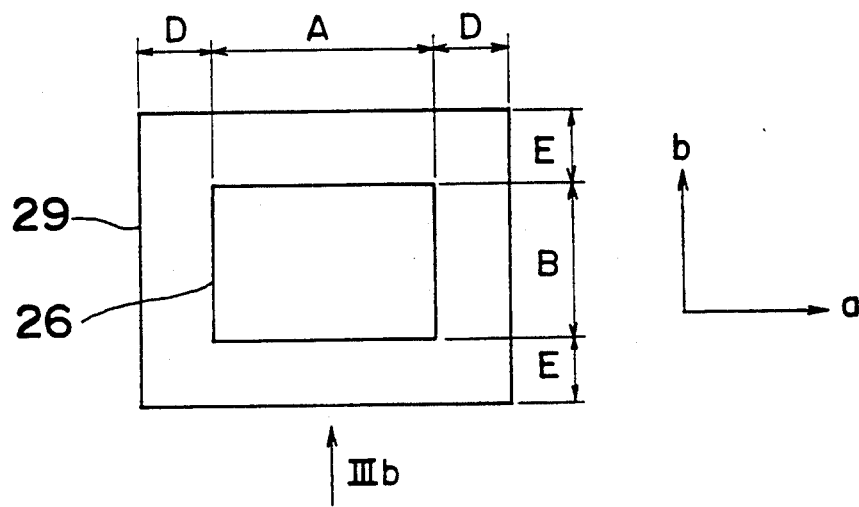
FIG. 3(a) is a schematic view showing the relative position of the discharge tube and the partition wall of FIG. 2.
Figure 3B:
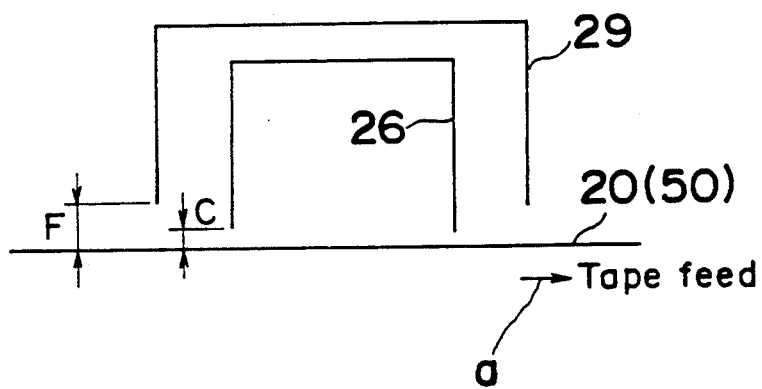
FIG. 3(b) is a schematic view as observed in the direction of the arrow IIIb in FIG. 3(a), showing the relative position of the discharge tube, the partition wall and a magnetic tape.

FIGS. 3(a) shows a relative position of the discharge tube 26 and the partition wall 29, while FIG. 3(b) shows a relative position of the magnetic tape 20, the discharge tube 26 and the partition wall 29. In FIG. 3(a), supposing that the magnetic tape 20 is fed in the direction of the arrow a and the direction of the arrow b is orthogonal to the direction of the arrow a, the discharge tube 26 has dimensions A and B in the directions of the arrows a and b, respectively. In the direction of the arrow a, a distance D exists between the discharge tube 26 and the partition wall 29. On the other hand, in the direction of the arrow b, a distance E exists between the discharge tube 26 and the partition wall 29. Meanwhile, in FIG.

3(b), a gap C exists between a distal end of the discharge tube 26 and the magnetic tape 20 and a gap F exists between a distal end of the partition wall 29 and the magnetic tape 20. The dimensions A to F of the plasma CVD apparatus K1 and the corrosion resistance of the magnetic tape 20 are shown in Table 1 below.

In Table 1, corrosion resistance of the magnetic tape 20 of the present invention in its practical performance is estimated by using a video tape recorder as follows. In order to obtain the magnetic tape 20 used for measuring its practical performance, the non-magnetic base 1 is formed by a polyester film of about 10 μm in thickness, while the ferromagnetic metallic thin film 2 mainly consists of Co and is provided on the base 1 to a thickness of about 1,800 Å. The diamondlike carbon film 4 having a Vickers hardness of about 2,500 kg/mm² and a thickness of 100 Å is provided on the metallic thin film 2.

TABLE 1

| Sample | D/A | E/B | | Corrosion resistance | |
|---|---|---|---|---|---|
| No. | (%) | (%) | F/C | I (min.) | II (min.) |
| 1 | 2 | 2 | 5 | 120 | 10 |
| 2 | 3 | 3 | 5 | 150 | 15 |
| 3 | 5 | 5 | 5 | 180 | 30 |
| 4 | 10 | 10 | 5 | >180 | 60 |
| 5 | 50 | 10 | 5 | >180 | 90 |
| 6 | 50 | 20 | 5 | >180 | 120 |
| 7 | 50 | 50 | 5 | >180 | 120 |
| 8 | 100 | 20 | 5 | >180 | 90 |
| 9 | 100 | 50 | 5 | 180 | 60 |
| 10 | 150 | 20 | 5 | 150 | 60 |
| 11 | 200 | 20 | 5 | 150 | 15 |
| 12 | 250 | 20 | 5 | 120 | 10 |
| 13 | 50 | 20 | 0.8 | 120 | 10 |
| 14 | 50 | 20 | 1 | 150 | 20 |
| 15 | 50 | 20 | 3 | >180 | 60 |
| 16 | 50 | 20 | 5 | >180 | 120 |
| 17 | 50 | 20 | 8 | >180 | 60 |
| 18 | 50 | 20 | 10 | 150 | 20 |
| 19 | 50 | 20 | 12 | 120 | 10 |
| Comp. ex. 1 | — | — | — | 90 | 10 |

Furthermore, the lubricant layer 5, formed by fluorinated carboxylic acid and having a thickness of about 30 Å, is provided on the diamondlike carbon film 4. The thus obtained magnetic tape 20 is cut to a tape strip of about 10 m in length and 8 mm in width and the tape strip is run at 14 mm/sec. so as to record video signals by the video tape recorder in an environment having a temperature of 23° C. and a humidity of 70%. The video tape recorder includes a rotary cylinder having an outside diameter of 40 mm and two pairs of heads having a relative speed of 3.8 m/sec., a track pitch of about 20 μm and a protrusion height of 30 μm. By applying to the tape strip, a load twice a load applied at the time of its ordinary running, corrosion resistance of the tape strip is measured in an environment having a temperature of 23° C. and a humidity of 10%. Still frame life up to a time point when the tape strip yields no output due to flaws to the metallic thin film 2 is employed as an initial value I in Table 1. Furthermore, after the tape strip has been allowed to stand as it is at a temperature of 40° C. and a humidity of 90% for one month, corrosion resistance is measured under the same conditions as the initial value I and the measured value is expressed by II in Table 1.

Sample Nos. 1 to 19 correspond to the first embodiment of the present invention. For comparison of effects, Table 1 includes a comparative example 1 in which the diamondlike carbon film is formed without providing the partition wall 29 and a shield plate 41 of FIG. 4 and corrosion resistance of the magnetic tape is estimated after provision of the lubricant layer 5 as in the sample Nos. 1 to 19. In the sample Nos. 1 to 12, the value of (F/C) is set to 5, the value of (D/A) in the direction of the arrow a varies from 2 to 250% and the value of (E/B) in the direction of the arrow b varies from 2 to 50%. In the direction of the arrow b, it is not useful to provide the partition wall 29 at a location where opposite side edges of the partition wall 29 deviate far away from those of the magnetic tape 20. Thus, the value of (E/B) is set to not more than 50%.

In the sample Nos. 13 to 19, the value of (D/A) is set to 50%, while the value of (E/B) is set to 20%. Meanwhile, the value of (F/C) varies from 0.8 to 12.

In comparison with the comparative example 1, corrosion resistance of the sample Nos. 1 to 12 starts showing improvement when the values of (D/A) and (E/B) are approximately 3%. In the direction of the arrow a, the value of (D/A) of up to about 200% is effective. When the value of (D/A) exceeds 200%, the partition wall 29 has no effect, which is tantamount to a case where the partition wall 29 is not provided. Meanwhile, in the direction of the arrow b, the value of (E/B) of up to about 50% is effective. However, when the value of (E/B) exceeds 50%, a state where the partition wall 29 is not provided will be obtained due to design of the plasma CVD apparatus K1 depending upon also the value of (D/A). Therefore, in the case of the magnetic tape 20, it is preferable that the value of (D/A) in the direction of the arrow a ranges 3 to 200% and the value of (E/B) in the direction of the arrow b ranges from 3 to 50%. In the sample Nos. 1 to 12, the sample No. 6 is most excellent.

Meanwhile, in the sample Nos. 13 to 19, corrosion resistance starts showing improvement when the value of (F/C) is about 1. It is considered that the value of (F/C) equal to about 5 is most effective. When the value of (F/C) exceeds 10, the partition wall 29 produces substantially no effect. Accordingly, in the case of the magnetic tape 20, it is desirable that the value of (F/C) ranges from 1 to 10. In view of efficiency for evacuating space between the discharge tube 26 and the partition wall 29 to vacuum, it is more desirable that the value of (F/C) ranges from 2 to 5.

As will be seen from the foregoing description of the plasma CVD film forming method according to the first embodiment of the present invention in which the partition wall is provided around the discharge tube and space between the partition wall and discharge tube is evacuated, since unreacted gas is exhausted at the time of formation of the diamondlike carbon film, contamination on the metallic thin film and the diamondlike carbon film is prevented. Therefore, adhesive force between the metallic thin film and the diamondlike carbon film and between the diamondlike carbon film and the lubricant layer is increased, and thus, entry of water into boundaries between the metallic thin film and the diamondlike carbon film and between the diamondlike carbon film and the lubricant layer is prevented. As a result, since the quantity of hydroxide produced at the boundaries between the metallic thin film and the diamondlike carbon film and between the diamondlike carbon film and the lubricant layer is greatly reduced, corrosion resistance of the magnetic tape is improved.

Figure 4:
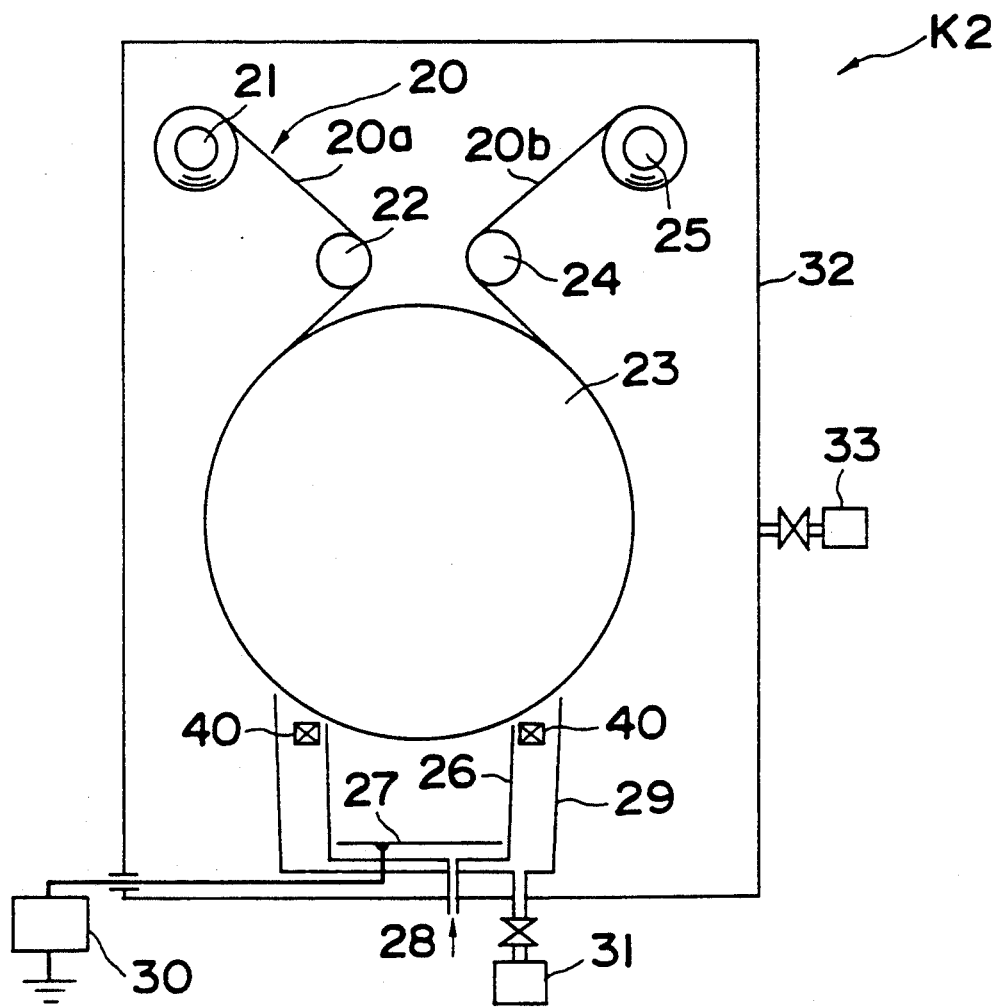
FIG. 4 is a view similar to FIG. 2, showing a second embodiment of the present invention in which an ultra-low temperature panel is provided in a space between a discharge tube and a partition wall.

FIG. 4 shows a plasma CVD apparatus K2 used in a plasma CVD film forming method according to a second embodiment of the present invention. In the plasma CVD apparatus K2, an ultra-low temperature panel 40 is provided in the space between the discharge tube 26 and the partition wall 29. Since the constructions of the plasma CVD apparatus K2 is otherwise similar to the plasma CVD apparatus K1, description thereof is abbreviated. In the second embodiment of the present invention, since unreacted gas leaked from the gap between the discharge tube 26 and the magnetic tape 20 into the space between the discharge tube 26 and the partition wall 29 is adsorbed by the ultra-low temperature panel 40 so as to be exhausted, contamination on the metallic thin film 2 and the diamondlike carbon film 4 is further reduced, so that corrosion resistance of the magnetic tape 20 in its practical performance is further improved. The dimensions A to F in the plasma CVD apparatus K2 are shown in Table 2 below. In Table 2, a sample No. 20 corresponds to the second embodiment of the present invention, and corrosion resistance of the magnetic tape 20, in which the diamondlike carbon film 4 is formed by providing the ultra-low temperature panel 40 of $-150°$ C. in addition to the dimensional requirements of the sample No. 7 of Table 1 is measured in the same manner as in Table 1.

TABLE 2

| Sample | D/A | E/B | | Corrosion resistance | |
| No. | (%) | (%) | F/C | I (min.) | II (min.) |
| --- | --- | --- | --- | --- | --- |
| 20 | 50 | 20 | 5 | >180 | >180 |
| Comp. ex. 1 | — | — | — | 90 | 10 |
| Comp. ex. 2 | — | — | — | 120 | 30 |

For comparison of effects, Table 2 includes the comparative example 1 of Table 1 and a comparative example 2 in which the diamondlike carbon film 4 is formed by providing the ultra-low temperature panel 4 at an arbitrary position in the vacuum chamber, and corrosion resistance of the magnetic tape is estimated after provision of the lubricant layer 5 as in the sample No. 20. It is seen from Table 2 that sample No. 20 is superior to sample No. 6, the best of sample Nos. 1 to 12 of Table 1.

Figure 5A:
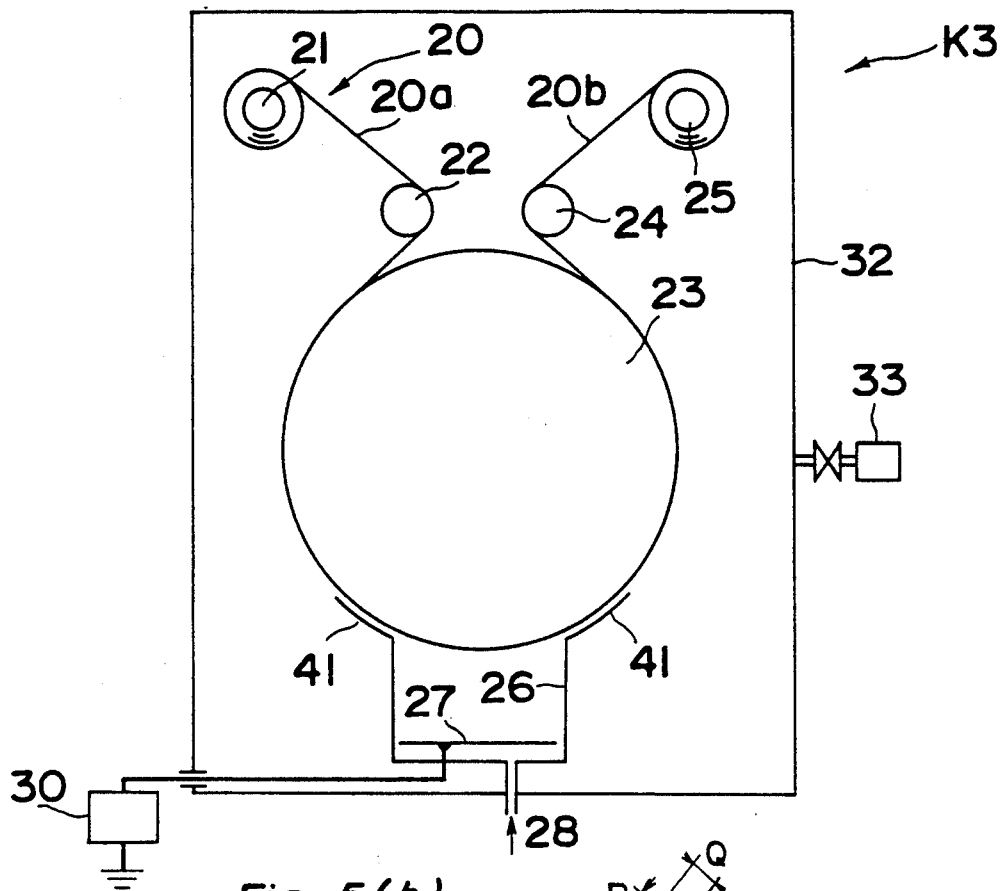
FIG. 5(a) is a view similar to FIG. 2, showing a third embodiment of the present invention in which a shield plate is provided at each of opposite distal end portions of a discharge tube.
Figure 5B:
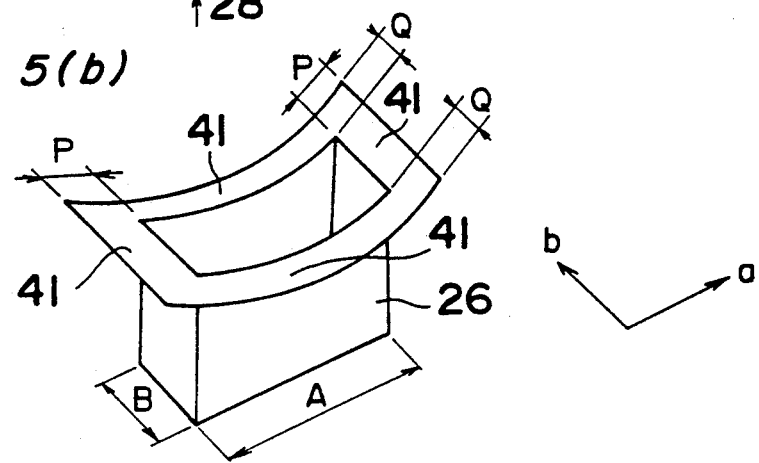
FIG. 5(b) is a perspective view of a discharge tube and a shield plate employed in the plasma CVD apparatus of FIG. 5(a)

Furthermore, FIGS. 5(a) and 5(b) show a plasma CVD apparatus K3 used in a plasma CVD film forming method according to a third embodiment of the present invention. As shown in FIG. 5(b), the shield plate 41 is provided at a brim of an opening of the discharge tube 26 in place of the partition wall 29 of the plasma CVD apparatus K1 so as to confront the magnetic tape 20. The shield plate 41 has dimensions P and Q in the directions of the arrows a and b, respectively. The dimensions P and Q of the shield plate 41 are so set as to be not less than twice the gap C between the distal end of the discharge tube 26 and the magnetic tape 20 and not less than 20% of the dimensions A and B of the discharge tube 26. Since other constructions of the plasma CVD apparatus K3 are similar to those of the plasma CVD apparatus K1, description thereof is abbreviated. In this embodiment, since pressure change between interior of the discharge tube 26 and the interior of the vacuum chamber 32 is gentle, abnormal discharge resulting from sudden pressure changes in the vicinity of inner periphery of the discharge tube 26 is eliminated, and thus the diamondlike carbon film 4 can be made quite uniform. Therefore, the number of dropouts of the magnetic tape 20 is reduced.

Table 3 below shows the number of dropouts of the magnetic tape 20. Table 3 includes sample Nos. 21 to 27 corresponding to the third embodiment of the present invention and the comparative example 1 of Table 1. In the sample Nos. 21 to 27, dropouts of the magnetic tape 20, in which the diamondlike carbon film 4 is formed by setting the size of the shield plate 41 to a value not less than 20% of dimension of the discharge tube 26 and ranging from 1.5 times to 120 times the gap C (FIG. 3(b)) between the magnetic tape 20 and the discharge tube 26, are measured. When recording and reproduction are performed in an environment having a temperature of 23° C. and a humidity of 70% for 10 minutes by using the video tape recorder referred to above, the number of occurrences of an event in which loss of reproduced signals amounts to not less than 16 dB for not less than 15 $\mu$sec. is used as the number of dropouts of the magnetic tape 20. In Table 3, the number of dropouts of the magnetic tape 20 is converted to a value counted for one minute.

TABLE 3

| Sample No. | (Length of shield plate)/ (gap C) | Number of dropouts per minute |
| --- | --- | --- |
| 21 | 1.5 | 50–100 |
| 22 | 2 | 30–50 |
| 23 | 5 | 10–30 |
| 24 | 10 | 3–10 |
| 25 | 50 | 10–30 |
| 26 | 100 | 30–50 |
| 27 | 120 | 50–100 |
| Comp. ex. 1 | — | 50–100 |

In the sample Nos. 21 to 27, the number of dropouts starts showing improvement over a comparative example 1 when the ratio of size of the shield plate 41 to the gap C is about 2. The ratio of 5 to 10 is quite effective and the ratio of up to about 100 is remains effective. However, when the ratio exceeds 100, the conductance of the discharge tube 26 becomes small as a vacuum evacuation system, so that a high quality of the diamondlike carbon film cannot be achieved, and thus the diamondlike carbon film is not suitable as a protective film for the magnetic tape. Therefore, in the case of the magnetic tape it is desirable that size of the shield plate 41 not only is not less than 20% of dimension of the discharge tube, but ranges from 2 times to 100 times the gap C between the magnetic tape and the discharge tube. In view of design of the plasma CVD apparatus K3, it is more desirable that the size of the shield plate 41 ranges from 5 times to 10 times the gap C.

As will be apparent from the foregoing plasma CVD film forming apparatus according to the third embodiment of the present invention, in which the shield plate is provided at the distal end portion of the discharge tube, abnormal discharge resulting from sudden pressure changes between the discharge tube and the vacuum chamber is prevented, so that defects of the diamondlike carbon film are reduced, and thus the number of dropouts of the magnetic tape is lessened.

Figure 6:
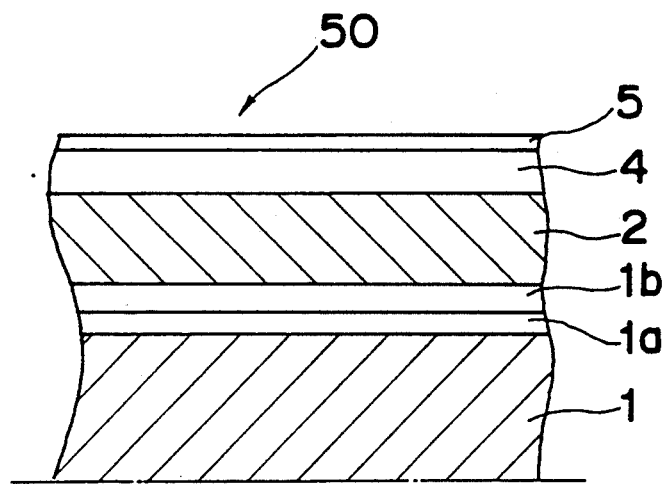
FIG. 6 is a sectional view of a magnetic disk produced by a plasma CVD film forming method according to a fourth embodiment of the present invention.

FIG. 6 shows a magnetic disk 50 produced by a plasma CVD film forming method according to a fourth embodiment of the present invention. The magnetic disk 50 includes a non-magnetic base 1 formed by an aluminum sheet of about 1.2 mm in thickness, a Ni-P plating 1a formed on the base 1 to a thickness of about 20 μm, a basic Cr layer 1b formed on the Ni-P plating 1a, a ferromagnetic metallic thin film 2 formed on the basic Cr layer 1b, a diamondlike carbon film 4 formed on the metallic thin film 2 and a lubricant layer 5 formed on the diamondlike carbon film 4. The basic Cr layer 1b is provided for improving orientation of the metallic thin film 2 and is obtained by sputtering Cr on the Ni-P plating 1a to a thickness of about 2,000 μ. Meanwhile, the metallic thin film 2 is obtained by sputtering Co-Ni-Cr alloy or the like on the basic Cr layer 1b to a thickness of about 700 Å. The diamondlike carbon film 4 is formed by a vacuum film forming method such as plasma CVD, while the lubricant layer 5 is formed by wet coating.

Figure 7:
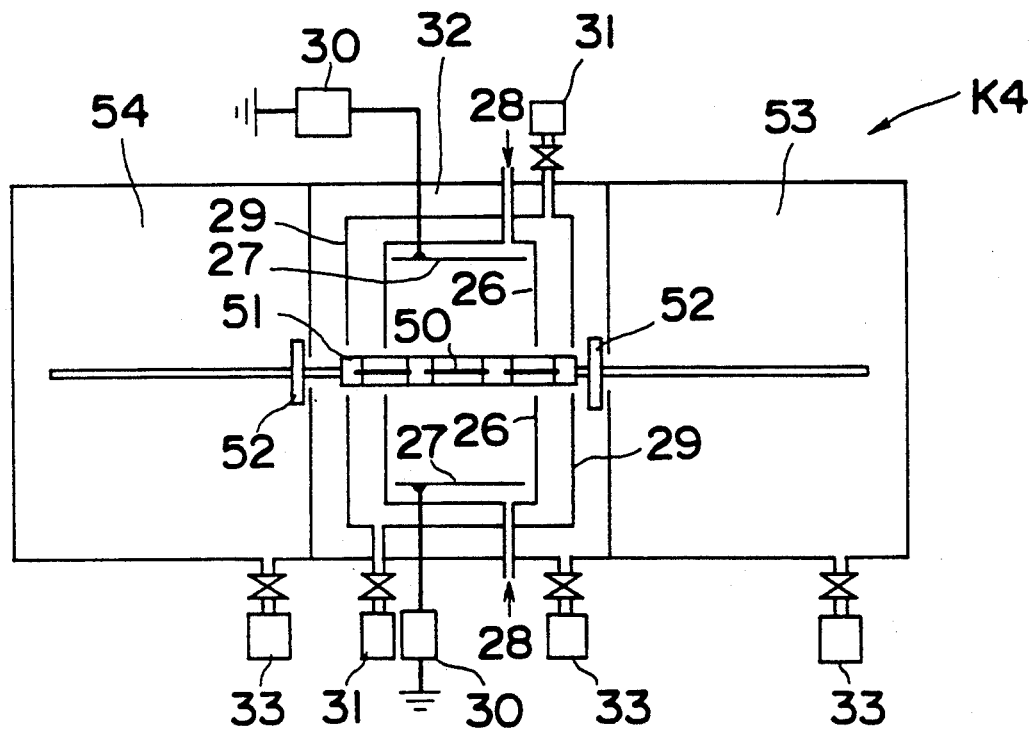
FIG. 7 is a schematic view of a plasma CVD apparatus used in the plasma CVD film forming method of FIG. 6, in which a partition wall is provided around a discharge tube.

FIG. 7 shows a plasma CVD apparatus K4 used in the plasma CVD film forming method of FIG. 6. In the plasma CVD apparatus K4, a carrier 51 is provided in place of the elements from the supply roller 21 to the take-up roller 25 in the plasma CVD apparatus K1. The plasma CVD apparatus K4 further includes a loading chamber 53 for loading an unworked magnetic disk into the carrier 51 in the vacuum chamber 32 and an unloading chamber 54 for unloading a worked magnetic disk from the carrier 51. A sluice valve 52 is provided each of between the loading chamber 53 and the vacuum chamber 32 and between the vacuum chamber 32 and the unloading chamber 54 so as to hermetically seal the unloading chamber 53, the vacuum chamber 32 and the unloading chamber 54. Since other constructions of the plasma CVD apparatus K4 are similar to those of the plasma CVD apparatus K1, description thereof is abbreviated.

The plasma CVD film forming method according to the fourth embodiment of the present invention is described with reference to FIG. 7 hereinbelow. Initially, the loading chamber 53 is released to atmosphere, and then the unworked magnetic disk, which as been formed up to the metallic thin film 2 is mounted on the carrier 51. Subsequently, at the time when the loading chamber 53 is evacuated to a predetermined degree of vacuum, the sluice valve 52 between the unloading chamber 53 and the vacuum chamber 32 is released, and thus the carrier 51 is conveyed to a region for forming the diamondlike carbon film 4. At this time, the discharge tube 26 and space between the discharge tube 26 and the partition wall 29 are also set to specific degree of vacuum. Since the diamondlike carbon film 4 is thereafter formed in the exactly same manner as in the first embodiment of the present invention, description thereof is abbreviated for the sake of brevity.

Since unreacted gas leaked at this time from the gap between the discharge tube 26 and the magnetic disk 50 is exhausted by the vacuum pump 31, contamination on the metallic thin film 2 and the diamondlike carbon film 4 of the magnetic disk 50 is prevented, and thus the adhesive force between the metallic thin film 2 and the diamondlike carbon film 4 and between the diamondlike carbon film 4 and the lubricant layer 5 can be increased. Therefore, CSS (contact-start-and-stop) characteristics of the magnetic disk 50 in its practical performance are improved, as shown in Table 4 below. In the plasma CVD apparatus K4, the relative position of the magnetic disk 50, the discharge tube 26 and the partition wall 29 is identical with that of the plasma CVD apparatus K1 shown in FIGS. 3(a) and 3(b).

TABLE 4

| Sample No. | D/A (%) | E/B (%) | F/C | Reliability Number of CSS |
|---|---|---|---|---|
| 51 | 2 | 2 | 10 | 500 |
| 52 | 3 | 3 | 10 | 1,000 |
| 53 | 5 | 5 | 10 | 3,000 |
| 54 | 10 | 10 | 10 | 10,000 |
| 55 | 20 | 20 | 10 | 20,000 |
| 56 | 50 | 20 | 10 | 30,000 |
| 57 | 50 | 50 | 10 | 50,000 |
| 58 | 50 | 100 | 10 | 20,000 |
| 59 | 100 | 100 | 10 | 10,000 |
| 60 | 150 | 150 | 10 | 5,000 |
| 61 | 200 | 200 | 10 | 2,000 |
| 62 | 250 | 250 | 10 | 500 |
| 63 | 50 | 50 | 0.8 | 500 |
| 64 | 50 | 50 | 1 | 2,000 |
| 65 | 50 | 50 | 3 | 10,000 |
| 66 | 50 | 50 | 5 | 20,000 |
| 67 | 50 | 50 | 8 | 40,000 |
| 68 | 50 | 50 | 10 | 50,000 |
| 69 | 50 | 50 | 12 | 1,000 |
| Comp. ex. 3 | — | — | — | 500 |

The magnetic disk 50 used for measuring the practical performance includes the base 1, formed by a 3.5" aluminum base, the Ni-P plating formed on the base 1 to a thickness of about 20 μm, and the basic Cr layer formed on the Ni-P plating to a thickness of about 2,000 Å by sputtering. The metallic thin film 2 is formed by sputtering Co-Ni-Cr alloy on the basic Cr layer to a thickness of about 700 Å. Then, the diamondlike carbon film 4 having a Vickers hardness of 2,500 kg/mm$^2$ is formed on the metallic thin film 2 to a thickness of 200 Å. Furthermore, the lubricant layer 5, formed by perphloropolyether, is provided on the diamondlike carbon film 4 to a thickness of about 30 Å.

In Table 4, CSS (contact-start-and-stop) tests of sample Nos. 51 to 69 of the present invention and a comparative example 3 are performed by using a commercially available hard disk drive. The sample Nos. 51 to 69 correspond to the fourth embodiment of the present invention. In the sample Nos. 51 to 62, the value of (F/C) is set to 10. Meanwhile, by changing the values of (D/A) and (E/B) between 2% and 200% in the directions of the arrows a and b, respectively, the diamondlike carbon film 4 is formed, and thus the samples are obtained. In the case of a magnetic disk, if the partition wall 29 is provided at such a location as to be spaced far away from a peripheral edge of the magnetic disk 50, the carrier 51 becomes large and thus, the plasma CVD apparatus K4 itself is increased in size. Therefore, the values of (D/A) and (E/B) are limited to 250%.

On the other hand, in the sample Nos. 63 to 69, the values of (D/A) and (E/B) are fixed at 50%, while the value of (F/C) is changed from 0.8 to 12. Thus, CSS tests of the sample Nos. 51 to 69, formed with the diamondlike carbon film 4, are performed. Meanwhile, in the comparative example 3, the diamondlike carbon film 4 is formed without providing the partition wall 29 and the shield plate 41, and then the lubricant layer 5 is formed on the diamondlike carbon film 4. The thus obtained comparative example 3 undergoes CSS tests.

In the CSS test, a slider of the hard disk drive is made of so-called "altic", i.e. a composite ceramic material of Al$_2$O$_3$ and TiC, and is brought, at a cycle of about 30 sec., into and out of contact with the magnetic disk rotating at about 3,600 r.p.m. so as to apply a load of about 10 g to the rotating magnetic disk at the time of its contact with the magnetic disk. In Table 3, CSS tests are performed in an environment having a temperature of 5° C. and a humidity of 10% and the number of CSS tests up to crushing of the head of the hard disk drive due to the production of flaws on the magnetic disk is recited.

In comparison with the comparative example 3, reliability of the sample Nos. 51 to 62 start showing improvement when the values of (D/A) and (E/B) are about 3%. In the directions of the arrows a and b, the values of (D/A) and (E/B) up to 200% are effective. When the values of (D/A) and (E/B) exceed 200%, the partition wall 29 has no effect, which is equivalent to a case where the partition wall 29 is not provided. Therefore, in the case of the magnetic disk, it is desirable that the values of (D/A) and (E/B) range from 3% to 200%. Meanwhile, in view of design of the plasma CVD apparatus K4, it is more preferable that the values of (D/A) and (E/B) range from 20% to 50%.

Meanwhile, the reliability of the sample Nos. 63 to 69 starts showing improvement when the value of (F/C) is about 1.0. In the sample Nos. 63 to 69, the value of (F/C) equal to about 5 is most effective. When the value of (F/C) exceeds 10, the partition wall produces substantially no effect. Accordingly, in the case of the magnetic disk, it is desirable that the value of (F/C) ranges from 1 to 10. Furthermore, in view of efficiency for evacuating space between the discharge tube 26 and the partition wall 29, it is more preferable that the value of (F/C) ranges from 2 to 5.

Figure 8:
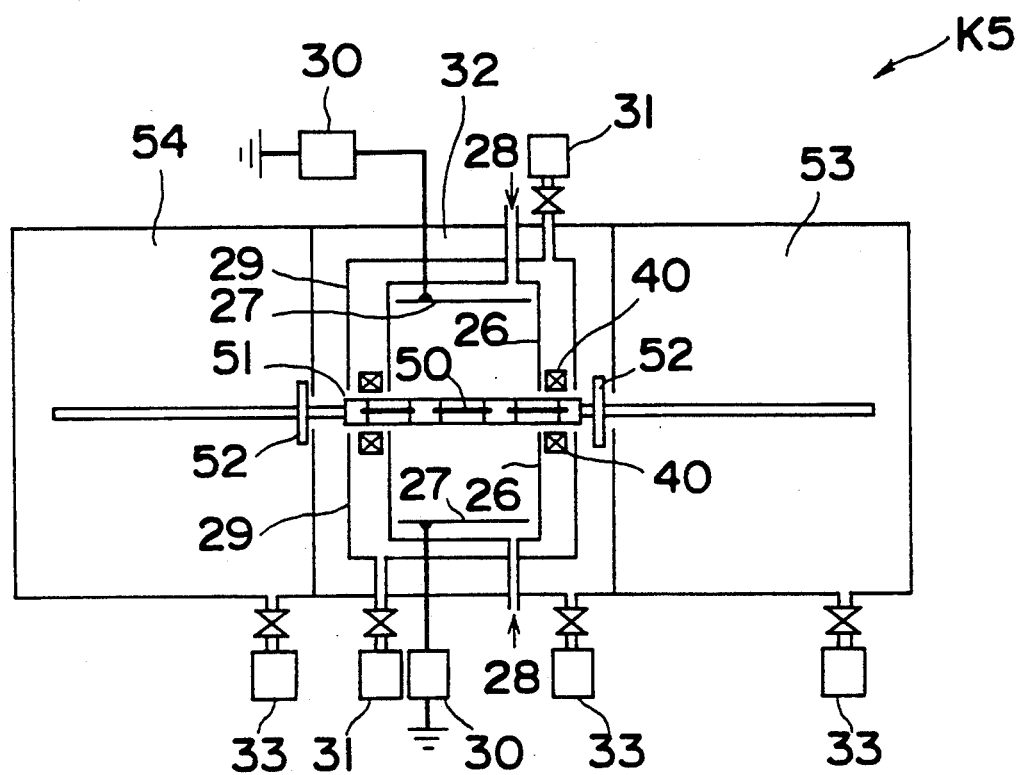
FIG. 8 is a view similar to FIG. 7, showing a fifth embodiment of the present invention in which an ultra-low temperature panel is provided between a discharge tube and a partition wall.

FIG. 8 shows a plasma CVD apparatus K5 used in a plasma CVD film forming method according to a fifth embodiment of the present invention. The plasma CVD apparatus K5 is different from the plasma CVD apparatus K4 in that upper and lower ultra-low temperature panels 40 are provided in space between the discharge tube 26 and the partition wall 29. Since the construction of the plasma CVD apparatus K5 is otherwise similar to that of the plasma CVD apparatus K4, description thereof is abbreviated.

In this embodiment, since unreacted gas leaked from the gap between the discharge tube 26 and the magnetic disk 50 is adsorbed and exhausted by the ultra-low temperature panels 40, contamination on the metallic thin film 2 and the diamondlike thin film 4 is further reduced, and thus the CSS characteristics of the magnetic disk 50, in its practical performance, is further improved.

Table 5 below shows results of CSS tests of a sample No. 70 of the present invention, the comparative example 3 of Table 4 and a comparative example 4.

TABLE 5

| Sample No. | D/A (%) | E/B (%) | F/C | Reliability Number of CSS |
|---|---|---|---|---|
| 70 | 50 | 50 | 10 | >60,000 |
| Comp. ex. 3 | — | — | — | 500 |
| Comp. ex. 4 | — | — | — | 5,000 |

In Table 5, the sample No. 70 corresponds to the fifth embodiment of the present invention, and CSS tests of the magnetic disk 50, in which the diamondlike carbon film 4 is formed by providing the ultra-low temperature panels 40 of −150° C. in addition to the dimensional requirements of the sample No. 57 of Table 4, are performed in the same manner as in Table 4. Meanwhile, in the comparative example 4, the diamondlike carbon film 4 is formed by providing the ultra-low temperature panel 40 at an arbitrary position in the vacuum chamber 32, and then the lubricant layer 5 is formed on the diamondlike carbon film 4. The thus obtained comparative example is subjected to CSS tests.

It is apparent from Table 5 that the sample No. 70 is superior to the sample No. 57, the best of the sample Nos. 51 to 69 of Table 4.

Figure 9A:
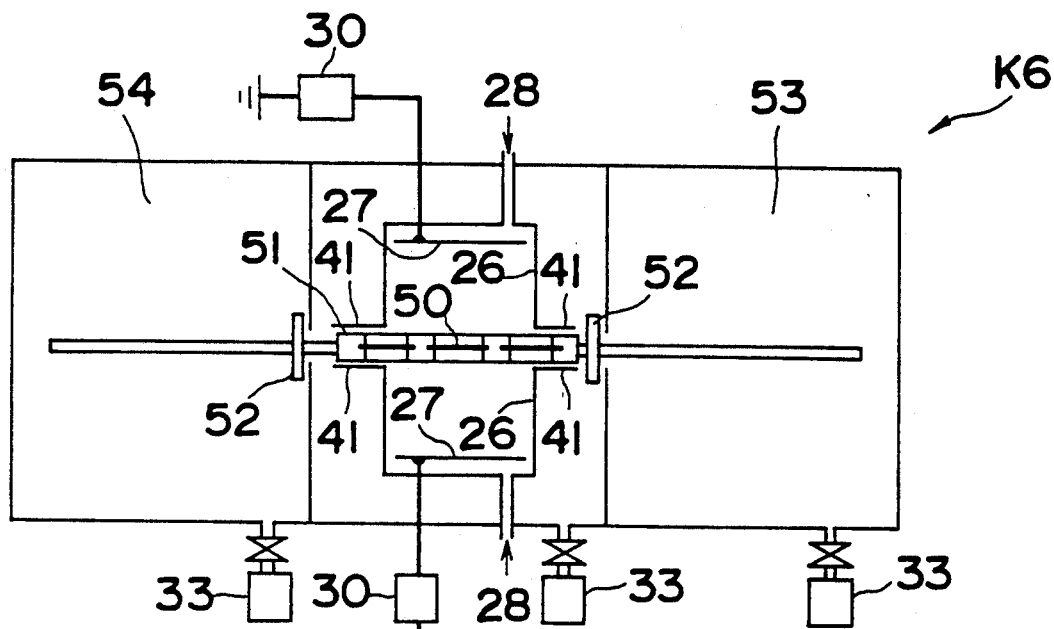
FIG. 9(a) is a view similar to FIG. 7, showing a sixth embodiment of the present invention in which a shield plate is provided at each of opposite distal end portions of a discharge tube.
Figure 9B:
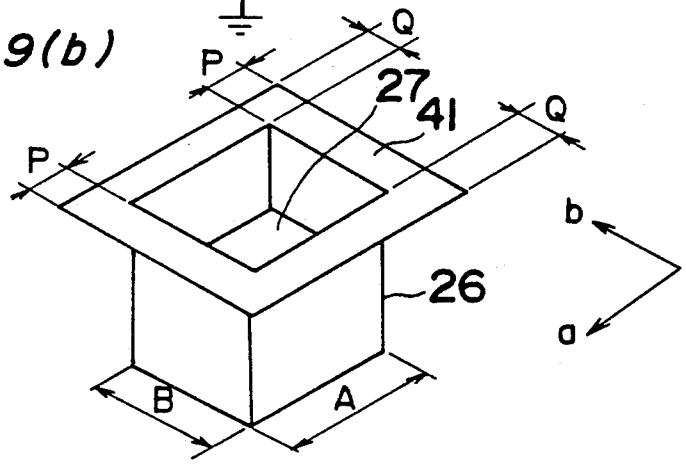
FIG. 9(b) is a perspective view of a discharge tube and a shield plate employed in the plasma CVD apparatus of FIG. 9(a).

FIGS. 9(a) and 9(b) show a plasma CVD apparatus K6 used in a plasma CVD film forming method according to a sixth embodiment of the present invention. The plasma CVD apparatus K6 is different from the plasma CVD apparatus K4 in that the shield plate 41 is provided at the brim of the opening of the discharge tube 26 in the plasma CVD apparatus K6 in place of the partition wall 29 of the plasma CVD apparatus K4. In the same manner as in the plasma CVD apparatus K3, the shield plate 41 has the dimensions P and Q in the directions of the arrows a and b, respectively, as shown in FIG. 9(b). The dimensions P and Q of the shield plate 41 are so set as to be not less than twice the gap C between the distal end of the discharge tube 26 and the magnetic disk 50 and not less than 20% of the dimensions A and B of the discharge tube 26. Since the construction of the plasma CVD apparatus K6 is otherwise similar to the plasma CVD apparatus K4, description thereof is abbreviated.

In this embodiment, since pressure changes between interior of the discharge tube 26 and interior of the vacuum chamber 32 are gentle, abnormal discharge resulting from a sudden pressure change in the vicinity of inner periphery of the discharge tube 26 is eliminated, and thus the diamondlike carbon film 4 can be made quite uniform. Therefore, in the magnetic disk 50, CSS characteristics, especially in a low-temperature and low-humidity environment, are improved.

Table 6 below shows results of CSS tests of sample Nos. 71 to 77 of the present invention and the comparative example 3 of Table 4. In the sample Nos. 71 to 77, CSS tests of the magnetic disk 50, in which the diamondlike carbon film 4 is formed by setting the size of the shield plate 41 to a value not less than 20% of dimension of the discharge tube 26, and ranging from 1.5 times to 120 times the gap C (FIG. 3(b)) between the magnetic disk 50 and the discharge tube 26, are performed in the same manner as in Table 4.

TABLE 6

| Sample No. | Length of shield plate)/ (gap C) | Number of CSS |
|---|---|---|
| 71 | 1.5 | 500 |
| 72 | 2 | 2,000 |
| 73 | 5 | 20,000 |
| 74 | 10 | 50,000 |
| 75 | 50 | 30,000 |
| 76 | 100 | 3,000 |
| 77 | 120 | 500 |
| Comp. ex. 3 | — | 500 |

In comparison with the comparative example 3, the number of CSS starts show improvement when the ratio of size of the shield plate 41 to the gap C between the magnetic disk 50 and the discharge tube 26 is about 2. The ratio of 5 to 20 is quite effective and the ratio of up to about 100 remains effective. However, when the ratio exceeds 100, the conductance of the discharge tube 26 becomes small as a vacuum evacuation system, so that a high quality of the diamondlike carbon film cannot be achieved, and thus the diamondlike carbon film is not suitable as a protective film for the magnetic disk. Therefore, in the case of the magnetic disk, it is desirable that the size of the shield plate 41 ranges from 2 times to 100 times the gap C between the magnetic disk and the discharge tube. In view of the design of the plasma CVD apparatus K6, it is more desirable that the size of the shield plate 41 ranges from 5 times to 10 times the gap C. Meanwhile, when the size of the shield plate 41 is less than 20% of dimension of the discharge tube 26, the shield plate 41 produces no effect. Hence, the size of the shield plate 41 should be not less than 20% of the dimension of the discharge tube 26.

As will be seen from the foregoing description of the present invention, in plasma CVD in which the partition wall is provided around the discharge tube and the space between the discharge tube and the partition wall is evacuated, unreacted gas is exhausted at the time of formation of the diamondlike carbon film, and thus contamination of the metallic thin film and the diamondlike carbon film is prevented. As a result, since adhesive force between the metallic thin film and the diamondlike carbon film and between the diamondlike carbon film and the lubricant layer is increased, CSS characteristics are improved. Furthermore, when the ultra-low temperature panel is provided in the space between the discharge tube and the partition wall, unreacted gas is adsorbed and exhausted in close vicinity to the point of its leakage by the ultra-low temperature panel, and thus the effects of improved CSS characteristics are further enhanced.

Meanwhile, when the shield plate is provided at the distal end portion of the discharge tube, abnormal discharge resulting from a sudden pressure change between the discharge tube and the vacuum chamber can be prevented, and thus defects of the diamondlike carbon film are reduced. As a result, since damage to the head of the hard disk drive is lessened, CSS characteristics are improved.

Meanwhile, although only the diamondlike carbon film has been described as one example of protective films of the magnetic recording medium, reliability of a plasma-polymerized film acting as a protective film of the magnetic recording medium is also improved greatly. In addition, in the case of an insulating film for a semiconductor or liquid crystal and a photoelectric conversion element, their corrosion resistance and conversion efficiency are improved. Furthermore, in the case of a superconducting thin film, ampacity and service life are upgraded. Thus, the present invention has quite a wide range of industrial applications.

What is claimed is:

1. A method of forming a film on a substrate by plasma CVD, comprising the steps of:
   providing a discharge tube in a vacuum chamber;
   providing a partition wall around the discharge tube so as to define a space therebetween;
   evacuating the space between the discharge tube and the partition wall;
   providing the substrate at a position confronting the discharge tube; and
   effecting plasma discharge in the discharge tube to form a film on the substrate.

2. The method of claim 1, wherein:
   both the discharge tube and the partition wall have a distal end;
   a gap in a first direction between the distal end of the partition wall and the substrate is 1–10 times the size of a gap in the first tube direction between the distal end of the discharge tube and the substrate; and
   a distance in a second direction in a plane perpendicular to the first direction between the discharge tube and the partition wall is at least 3% of the size of said discharge tube in the second direction.

3. The method of claim 2, wherein the substrate is a magnetic recording medium and said step of effecting plasma discharge in the discharge tube forms the film on the substrate as a protective film for the magnetic recording medium.

4. The method of claim 1, wherein an ultra-low temperature panel is disposed in the space between the discharge tube and the partition wall.

5. The method of claim 4, wherein the substrate is a magnetic recording medium and said step of effecting plasma discharge in the discharge tube forms the film on the substrate as a protective film for the magnetic recording medium.

6. The method of claim 1, wherein the vacuum chamber and the space between the discharge tube and the partition wall are evacuated to different degrees of vacuum by separate vacuum pumps.

7. The method of claim 1, wherein the substrate is a magnetic recording medium and said step of effecting plasma discharge in the discharge tube forms the film on the substrate as a protective film for the magnetic recording medium.

8. A method of forming a film on a substrate by plasma CVD, comprising the steps of:
   providing a discharge tube having a distal end portion in a vacuum chamber;
   providing the substrate at a position confronting the discharge tube;
   providing a shield plate at the distal end portion of the discharge tube such that the shield plate confronts and extends substantially parallel with the substrate; and
   effecting plasma discharge in the discharge to form a film on the substrate.

9. The method of claim 8, wherein:
   the distal end portion of the discharge tube is spaced a gap from the substrate in a first direction;
   the shield plate has a width extending parallel to the substrate an amount not only at least twice the gap between the discharge tube and the substrate, but also at least 20% of a dimension of the discharge tube in a plane perpendicular to the first direction.

10. The method of claim 9, wherein the substrate is a magnetic recording medium and said step of effecting plasma discharge in the discharge tube forms the film on the substrate as a protective film for the magnetic recording medium.

11. The method of claim 8, wherein the substrate is a magnetic recording medium and said step of effecting plasma discharge in the discharge tube forms the film on the substrate as a protective film for the magnetic recording medium.

* * * * *